(12) United States Patent
Lee

(10) Patent No.: US 6,770,961 B2
(45) Date of Patent: Aug. 3, 2004

(54) CARRIER FRAME AND SEMICONDUCTOR PACKAGE INCLUDING CARRIER FRAME

(75) Inventor: Ki Wook Lee, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/115,218

(22) Filed: Apr. 2, 2002

(65) Prior Publication Data

US 2002/0149092 A1 Oct. 17, 2002

(30) Foreign Application Priority Data

Apr. 11, 2001 (KR) .......................................... 2001-19341

(51) Int. Cl.$^7$ .......................... H01L 23/22; H01L 23/24
(52) U.S. Cl. ...................................... 257/687; 257/787
(58) Field of Search .............................. 257/787, 667; 438/126, 124, 112, 127, 106

(56) References Cited

U.S. PATENT DOCUMENTS

| | | | | |
|---|---|---|---|---|
| 5,371,404 A | * | 12/1994 | Juskey et al. ............... | 257/659 |
| 5,736,785 A | | 4/1998 | Chiang et al. | |
| 5,859,475 A | | 1/1999 | Freyman et al. | |
| 5,877,552 A | | 3/1999 | Chiang | |
| 5,977,626 A | * | 11/1999 | Wang et al. ................ | 257/707 |
| 6,011,304 A | * | 1/2000 | Mertol ....................... | 257/706 |
| 6,187,613 B1 | * | 2/2001 | Wu et al. ................... | 438/108 |
| 6,191,360 B1 | * | 2/2001 | Tao et al. ................... | 174/52.4 |
| 6,229,702 B1 | * | 5/2001 | Tao et al. ................... | 361/704 |
| 6,246,115 B1 | * | 6/2001 | Tang et al. ................. | 257/706 |
| 6,323,066 B2 | | 11/2001 | Lai et al. | |
| 6,359,335 B1 | * | 3/2002 | Distefano et al. ........... | 257/707 |
| 6,379,997 B1 | * | 4/2002 | Kawahara et al. .......... | 438/106 |
| 6,462,405 B1 | * | 10/2002 | Lai et al. .................... | 257/675 |
| 6,501,157 B1 | * | 12/2002 | Cobbley ..................... | 257/669 |

\* cited by examiner

*Primary Examiner*—Kamand Cuneo
*Assistant Examiner*—Asok Kumar Sarkar
(74) *Attorney, Agent, or Firm*—Weiss, Moy & Harris, P.C.

(57) ABSTRACT

A carrier frame and semiconductor package including a carrier frame provide improved thermal performance and mechanical stability for semiconductor packages using thin substrate materials. A metal carrier frame is attached to a substrate to provide support during and after the manufacturing process. A semiconductor die is mounted through an aperture in the center of the carrier frame and electrically connected to the substrate via wire bonding. The assembly is then encapsulated and singulated and a portion of the carrier frame remains in the package, improving thermal transfer from the semiconductor die. The assembly may further include a header for covering the aperture after the semiconductor die is wire bonded. The header/carrier combination may include means for improving encapsulant flow to the region under the header and surrounding the semiconductor die, which may include cut portions in the carrier frame or aligned holes through the carrier frame and header. The connection of header and carrier frame may be made self-aligning via protrusions on the header and depressions in the carrier frame or other mechanical alignment means.

20 Claims, 13 Drawing Sheets

US 6,770,961 B2

CARRIER FRAME AND SEMICONDUCTOR PACKAGE INCLUDING CARRIER FRAME

FIELD OF THE INVENTION

The present invention relates generally to integrated circuit packaging and more specifically, to a semiconductor package assembly that includes a carrier frame for mounting a semiconductor die.

BACKGROUND OF THE INVENTION

Semiconductor packages are generally constructed by mounting and electrically connecting a semiconductor die (which may contain any of a variety of electrical circuits and distributing connections) to a substrate. The substrate and semiconductor die are typically sealed by an encapsulant, to protect the semiconductor die and circuits from external environments such as dust, moisture and electrical and mechanical shock. A printed circuit board, circuit tape, circuit film or lead frame are generally used as the substrate.

Typical semiconductor packages are manufactured in a variety of ways. Recently, in order to meet demands for low weight, small and thin packages as well as simplicity of manufacture and assembly, circuit tape and similar thin structures having a high interconnect density are used as substrates. In the above-mentioned type of semiconductor package, since the substrate easily bends during the manufacturing process, most manufacturing processes are performed using a metal carrier frame is attached to the top surface of the substrate. The carrier frame is removed from the substrate after the completion of the manufacturing process.

However, the above-described conventional semiconductor package provides poor heat discharge, since the package is not provided with a heat sink. Recently, with a trend toward an increase in operating frequency of semiconductor dies, an inevitable increase in heat generation has occurred. Therefore, the above-described conventional semiconductor package is inappropriate for packaging semiconductor dies that generate high heat. If a high heat semiconductor die is packaged in the above described semiconductor package, warping can occur, resulting in cracking of the semiconductor die or separation of the semiconductor package from external electrical connections.

The above separation problem occurs when the semiconductor package is bent in its cross-section, that is, the substrate becomes concave or convex in shape. The result is that the semiconductor die cracks and/or the semiconductor package becomes disconnected external connections, due to a difference in the coefficient of thermal expansion among the elements of the semiconductor package and the absence of a means for preventing warping.

Therefore, it would be desirable to provide a semiconductor package having a thin profile and low weight that will not severely warp or crack the semiconductor die when heat is generated within the semiconductor package.

SUMMARY OF THE INVENTION

The above stated objectives are achieved in various assemblies and methods for packaging a semiconductor die that include a carrier frame within the completed semiconductor package assembly. The assemblies include a carrier frame, a substrate, a semiconductor die and an encapsulation. The carrier frame provides support for thin substrates during and after the manufacturing process and may further provide a heat sink after manufacture of the semiconductor package. The carrier frame defines an aperture through a center portion that is raised above the plane of the carrier frame for accommodating a semiconductor die underneath. The aperture may be covered by a header that is attached to the carrier frame after the semiconductor die is attached and wire bonded to the substrate.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1A:
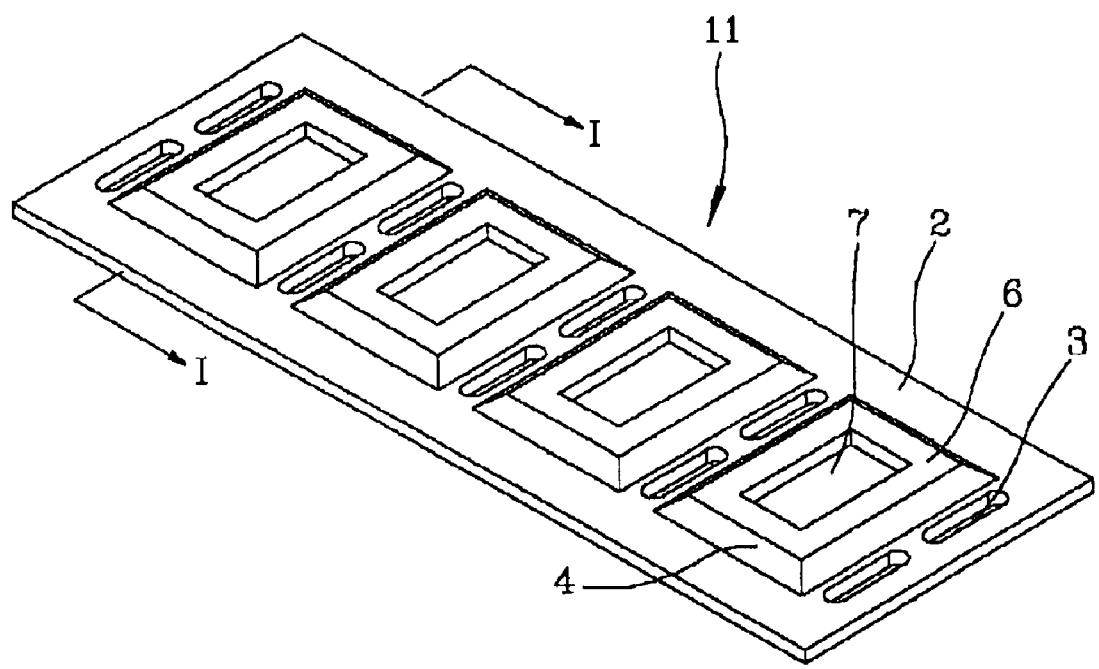
FIG. 1A is a perspective view of a carrier frame in accordance with an embodiment of the present invention.
Figure 1B:
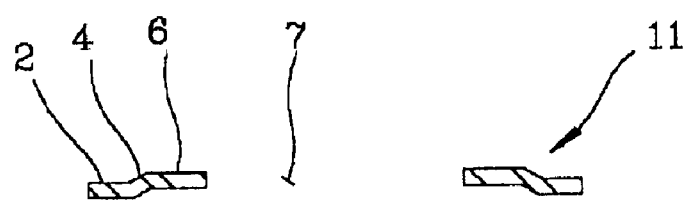
FIG. 1B is a cross-sectional view of the carrier frame of FIG. 1A.

Referring to both FIGS. 1A and 1B, a perspective and cross-sectional view of a semiconductor package in accordance with an embodiment of the present invention is illustrated.

A substantially rectangular carrier frame 11 including a substantially planar outer frame 2 is provided for integration within a semiconductor package by attachment to s substrate (not shown). Carrier frame 11 includes a raised portion defined by an inclined surface 4 having a predetermined within outer frame 2. An inner frame 6 is formed at an area within the boundary defined by the inside of inclined surface 4. Inner frame 6 is substantially planar and parallel to outer frame 2 and defines an aperture 7 formed at the center of inner frame 6 for mounting a semiconductor die to a substrate underneath aperture 7.

A plurality of inclined surfaces 4 and inner frames 6 are formed on carrier frame 11 and are arranged in a line. The structures formed by inclined surfaces 4 and inner frames 6 are bounded between by a slot 3 formed in outer frame 2 to provide a strip type carrier frame 11. Aperture 7 can be formed in a rectangular or square shape, depending on semiconductor die mounting requirements. Outer frame 2, inclined surface 4 and inner frame 6 may be any metal material having high thermal conductivity, such as aluminum (Al), copper (Cu) or iron (Fe). In an alternative embodiment, inner frame 6 of the carrier frame 11 is subjected to an oxidation process on the surface of inner frame 6, or may include a plurality of holes or depressions (not shown) in order improve bonding an encapsulant at those surfaces when an encapsulant is applied.

Figure 2A:
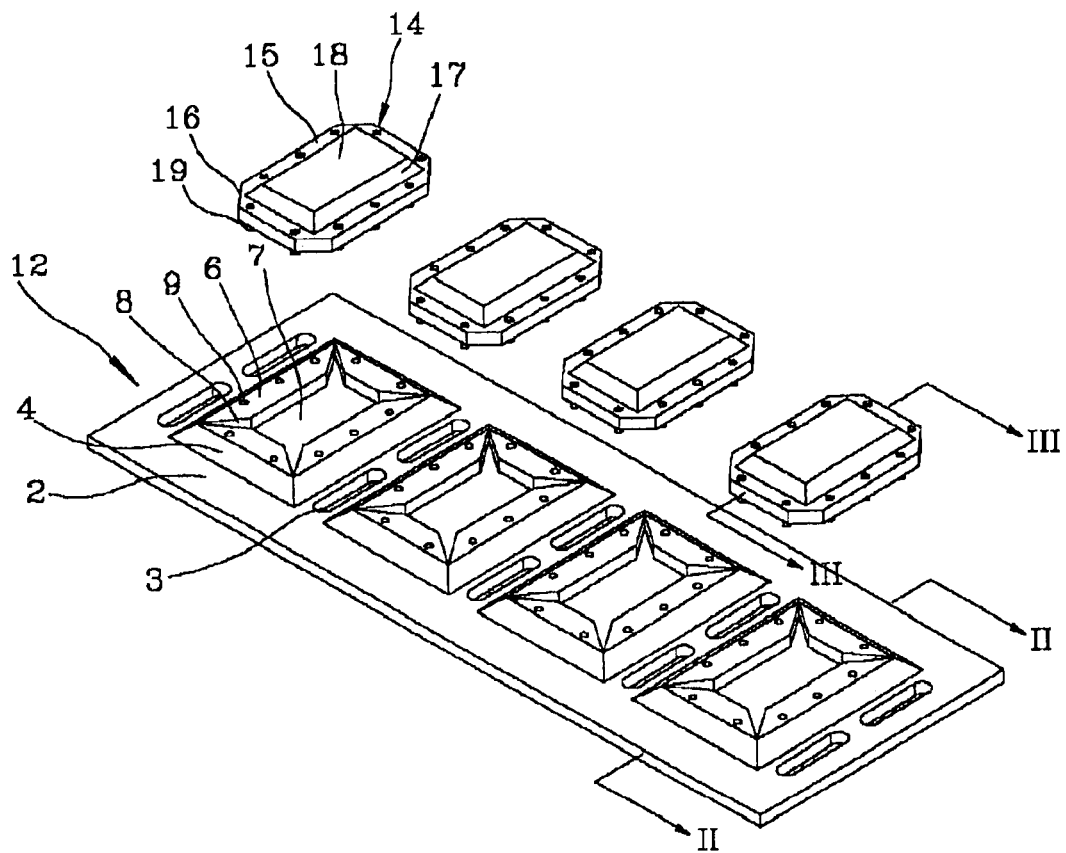
FIG. 2A is a perspective view of a carrier frame in accordance with another embodiment of the present invention.
Figure 2B:
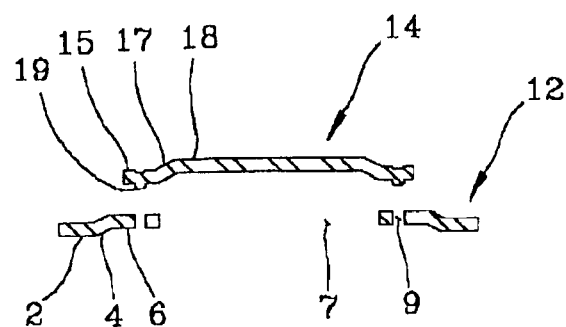
FIG. 2B is a cross-sectional view of the carrier frame of FIG. 2A.

Referring now to FIGS. 2A and 2B a perspective and a cross-sectional view of another embodiment of the present invention are illustrated. A plurality of cut portions 8 having a predetermined breadth can formed at each of the corners of inner frame 6 of a carrier frame 12 around aperture 7, to provide a improved flow of encapsulant during manufacture of the semiconductor package.

An auxiliary frame 14 can be provided for coupling to the top surface of inner frame 6 of carrier frame 12. Auxiliary frame 14 includes a flange 15 parallel to the plane of the inner frame 6 and chamfers 16 formed at the corners, an inclined surface 17 extending from flange 15, and a cover 18 extending from inclined surface 17 for covering aperture 7. A plurality of protrusions 19 can be formed on the bottom surface of the flange 15 and a plurality of holes 9 can be further formed at the inner frame 6 of the carrier frame 12 corresponding to the locations of protrusions 19.

Auxiliary frame 14 is coupled with the top surface of inner frame 6 of carrier frame 12, after a semiconductor die is connected to a substrate by conductive wires. Protrusions 19 on flange 15 of auxiliary frame 14 are coupled with holes 9 of inner frame 6, providing a self-alignment mechanism. In an alternative embodiment, auxiliary frame 14 and inner frame 6 can be connected together by an attach material and without forming protrusions 19 and holes 9 in the components.

Auxiliary frame 14 is used as a heat sink in the semiconductor package and the material may be any metal material having high thermal conductivity, such as aluminum (Al), copper (Cu) or iron (Fe), improving thermal performance of the semiconductor package. In an alternative embodiment, inner frame 6 of carrier frame 11 is subjected to an oxidation process or similar process on its surface, and inner frame 6 may include a plurality of holes or depressions (not shown). The above-described oxidation, holes or depressions can be equally applied to all carrier auxiliary frames described below.

Figure 3A:
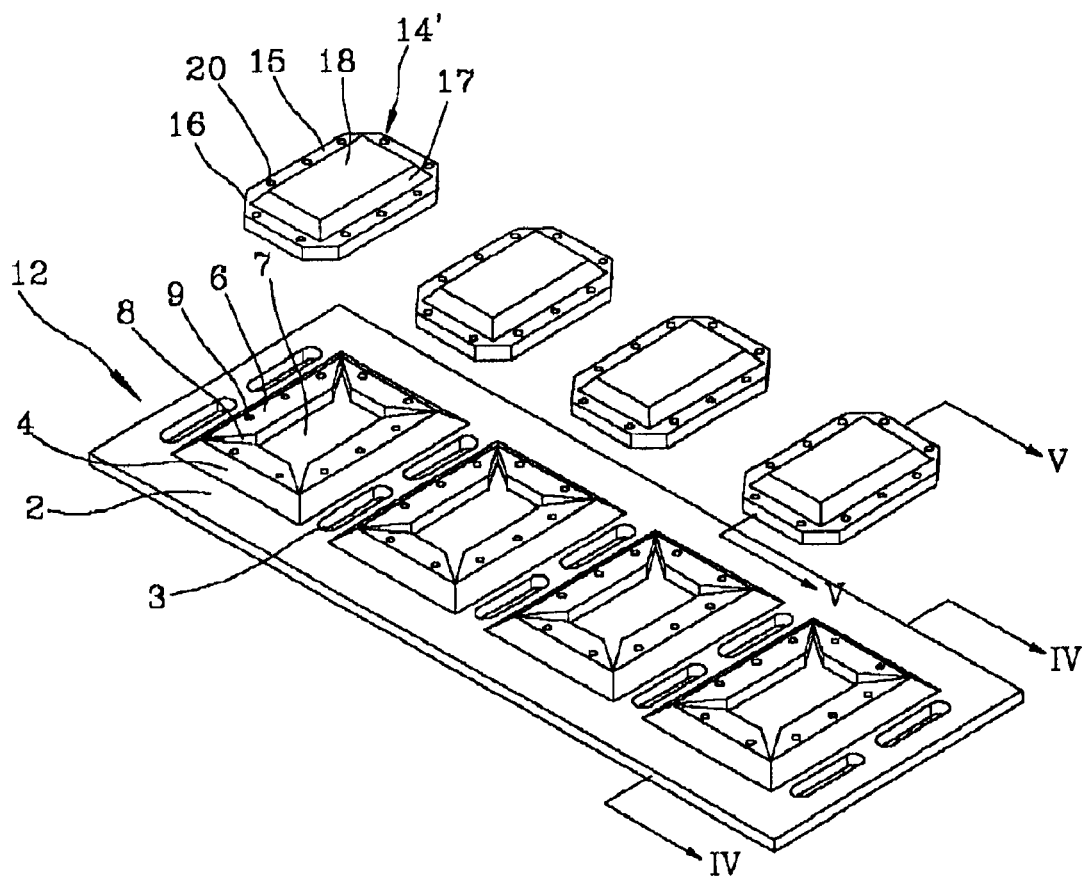
FIG. 3A is a perspective view of a carrier frame in accordance with another embodiment of the present invention.
Figure 3B:
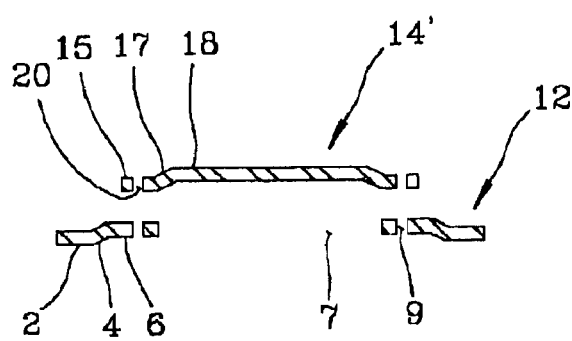
FIG. 3B is a cross-sectional view of the carrier frame of FIG. 3A.

Referring now to both FIGS. 3A and 3B, a perspective and a cross-sectional view of another embodiment of the present invention is illustrated. In FIGS. 3A and 3B, elements respectively corresponding to those in FIGS. 2A and 2B are denoted by the same reference numerals. A flange 15 of an auxiliary frame 14' located at the top surface of carrier frame 12 can further include a plurality of holes 20 having the same diameter as holes 9 of the inner frame 6 and corresponding in location to holes 9 of inner frame 6. Holes 20 of auxiliary frame 14' provide for ready flow of an encapsulant during manufacture of the semiconductor package. The operation of holes 9 and holes 20 will be described in detail in the description of the method of manufacturing the semiconductor package.

Figure 4A:
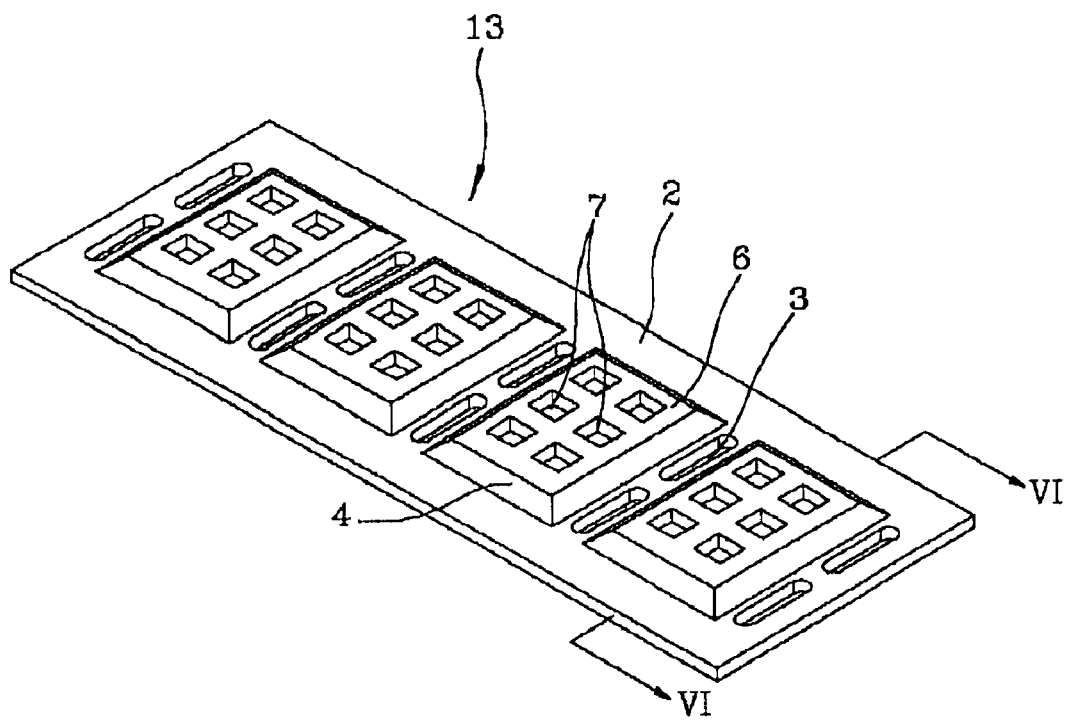
FIG. 4A is a perspective view of a carrier frame in accordance with another embodiment of the present invention.
Figure 4B:
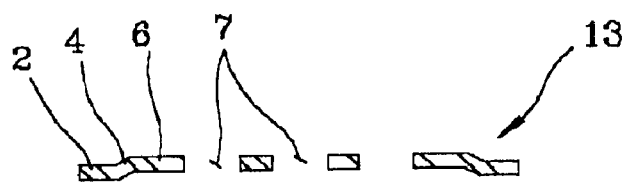
FIG. 4B is a cross-sectional view of the carrier frame of FIG. 3A.

Referring now to FIGS. 4A and 4B, a perspective and a cross-sectional view of another embodiment of the present invention is illustrated. A carrier frame 13 includes a plurality of inner frames 6 having a plurality of apertures 7, arrayed in rows and columns. Carrier frame 13 is adapter for attachment a matrix-type substrate. Generally, the present embodiment is used in tape array ball grid array (TABGA) manufacture.

Figure 5:
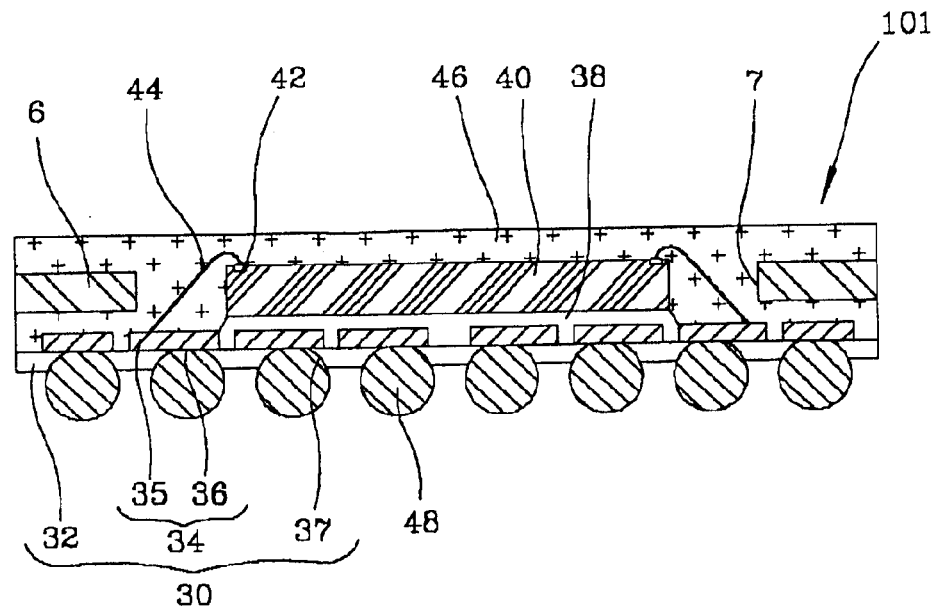
FIG. 5 is a cross-sectional view of a semiconductor package in accordance with an embodiment of the present invention.

Referring now to FIG. 5, a cross-sectional view of one embodiment of the present invention is illustrated. A semiconductor package 101 includes a semiconductor die 40 that includes a plurality of bond pads 42 at a top surface thereof. A Substrate 30, which has an area larger than semiconductor die 40 area, is attached to the bottom surface of semiconductor die 40 by a die attach material 38. Die attach material 38 may be an epoxy adhesive, epoxy film or an equivalent. Substrate 30 includes an insulating layer 32 and a conductive layer 34 having a plurality of bond fingers 35 and a plurality of lands 36 formed on a top surface. Lands 36 are exposed to the bottom of substrate 30 through a plurality of holes 37 formed through insulating layer 32. As is well known in the art, it is a circuit tape or a circuit film is desirable for implementing substrate 30.

Bond pads 42 of semiconductor die 40 and bond fingers 35 of conductive layer 34 of substrate 30 are electrically connected together by a plurality of wires 44. Wires 44 may be made from any conductive material such as gold (Au), Aluminum (Al) or an equivalent. An inner frame 6 is located at the top surface of the substrate 30. Inner frame 6 includes an aperture 7 having sufficient size such that semiconductor die 40 will not obstruct the inner frame 6. Inner frame 6 is separated by a predetermined distance from the substrate 30 and wire 44 is also separated from inner frame 6 in order to prevent electrical contact. Semiconductor die 40, the top surface of substrate 30, wires 44 and inner frame 6 are all encapsulated by an encapsulant 46. A plurality of solder balls 48 are fused to lands 36 of conductive layer 34 of substrate 30 for mechanical and electrical connection to an external device.

Figure 6:
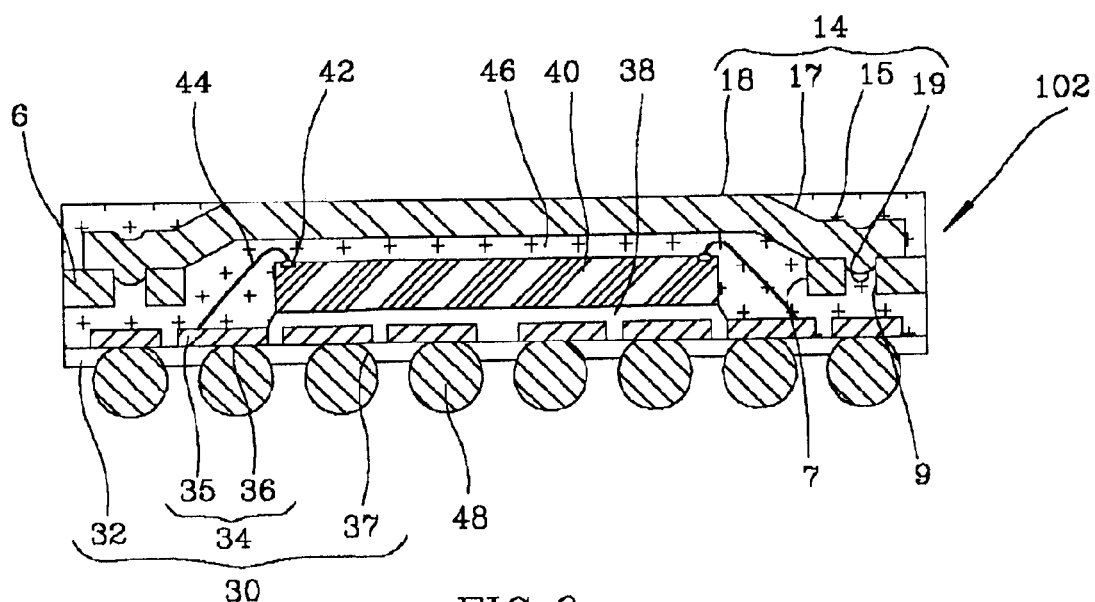
FIG. 6 is a cross-sectional view of a semiconductor package in accordance with another embodiment of the present invention.

Referring now to FIG. 6, a cross-sectional view of another embodiment of the present invention is illustrated. Since the illustration depicts a semiconductor package 102 similar to the semiconductor package 101 of FIG. 5, only those differences existing between the embodiments will be described in detail below. An auxiliary frame 14 (see FIGS. 2A and 2B) is located at the top surface of carrier frame 12 improve the thermal transfer from semiconductor package 102 and thereby prevent warping of substrate 30.

Auxiliary frame 14 includes flange 15, which is substantially planar and coupled to the top surface of inner frame 6. Auxiliary frame 14 further includes an inclined surface 17 that extends upward to from the inside of flange 15 to a cover 18 formed in the center of auxiliary frame 14 cover aperture 7 of inner frame 6. A plurality of holes 9 are formed through inner frame 6 and a plurality of protrusions 19 are further formed on the bottom surface of the flange 15 at locations corresponding to the locations of holes 9, so that auxiliary frame 14 and inner frame 6 are coupled together. The top surface of cover 18 is exposed to the outside of encapsulation 46, thereby further improving thermal performance.

Figure 7A:
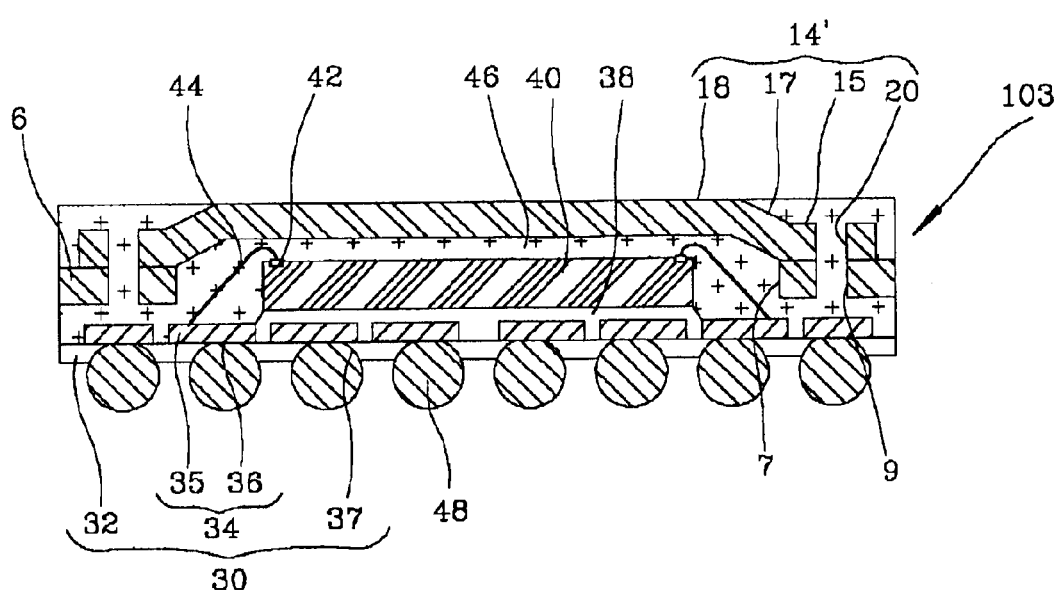
FIG. 7A is a cross-sectional view of a semiconductor package in accordance with another embodiment of the present invention.
Figure 7B:
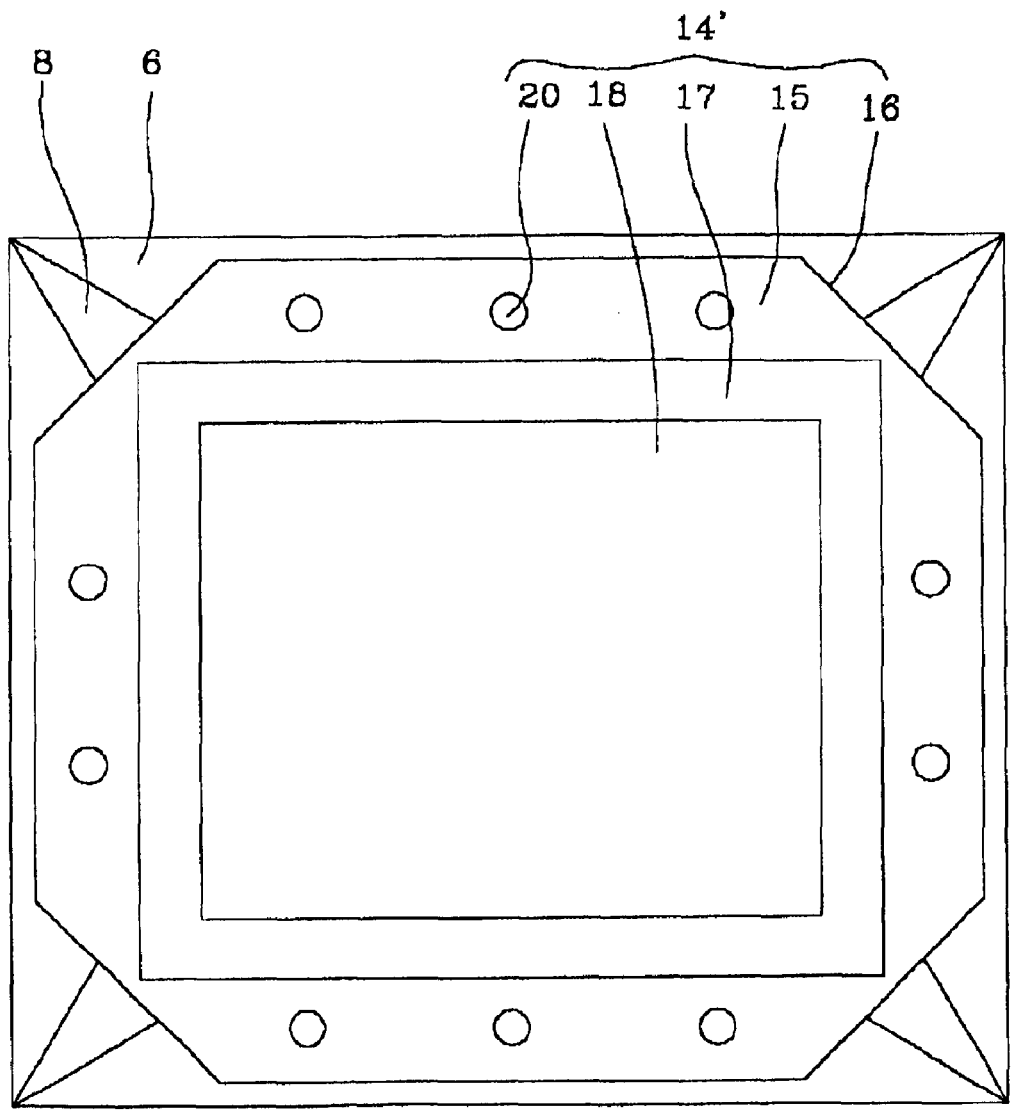
FIG. 7B is a plan view of the semiconductor package of FIG. 7A before an encapsulant is applied.

Referring next to FIGS. 7A and 7B, a semiconductor package 103 similar to semiconductor packages 102 of FIG. 6 is depicted and therefore only differences existing there between will be described in detail below. Flange 15 includes a plurality of holes 20 having the same diameter as holes 9 through inner frame 6. Encapsulation 46 is formed in part by encapsulant passing through holes 9 of inner frame 6 and holes 20 of auxiliary frame 14', thereby improving the bond between the encapsulant 46, inner frame 6 and auxiliary frame 14'.

Holes 9 and 20 of inner frame 6 and auxiliary frame 14' serve to improve flow of the encapsulant during manufacture of the semiconductor package. Encapsulant flows easily around semiconductor die 40 through cut portions 8, holes 20 of auxiliary frame 14' and holes 9 of inner frame 6. If holes 20 are not formed through auxiliary frame 14', encapsulant will only flow around semiconductor die 40 only through cut portion 8. Thus holes 20 of auxiliary frame 14' provide a means for permitting additional flow as described above, as well as the cut portions 8, thereby providing improved flow in the formation of encapsulation 46.

Figure 8A:
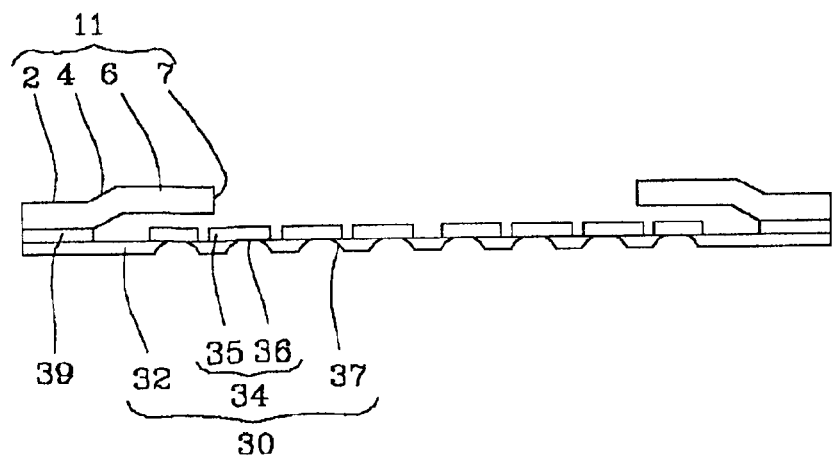
FIGS. 8A–8E are cross-sectional views illustrating a method for manufacturing a semiconductor package in accordance with an embodiment of the present invention.

FIG. 8A through FIG. 8E illustrate cross-sectional views for illustrating one method for manufacturing a semiconductor package in accordance with an embodiment of the present invention. Referring now to FIG. 8A, the semiconductor package is depicted after a carrier frame 11 is attached to a substrate. Carrier frame 11 includes an outer frame 2 that is substantially planar, an inclined surface 4 extending upward to the inside of outer frame 2, and inner frame 6 extending to the inside of inclined surface 4, having a planar surface parallel to outer frame 2. Aperture 7 for mounting a semiconductor die is disposed in the center of inner frame 6.

Substrate 30, on which conductive layer 34 including bond fingers 35 as well lands 36 is disposed, is attached to the bottom surface of outer frame 2 of carrier frame 11 by attach material 39 disposed between carrier frame 11 and substrate 30. Lands 36 are exposed through the bottom surface of substrate 30 through holes 37 formed through insulating layer 32.

Figure 8B:
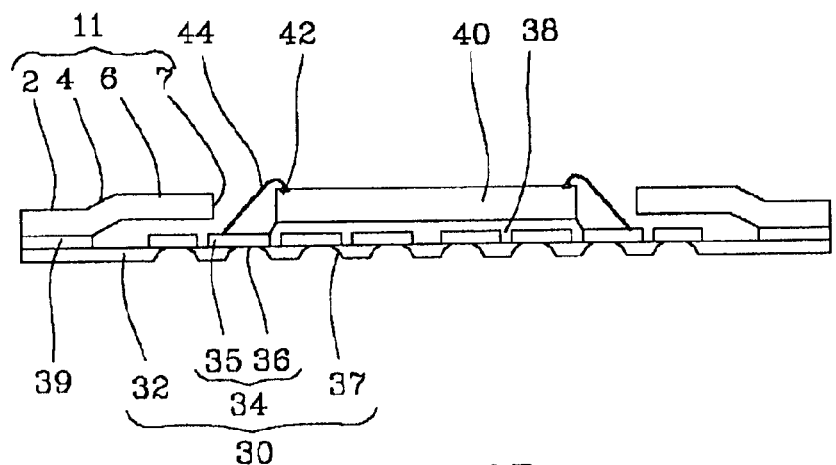

Referring next to FIG. 8B, a semiconductor package is depicted after a semiconductor die attach and a wire bonding step are performed. Semiconductor die 40 having bond pads 42 is attached to the top surface of substrate 30, which is exposed through carrier frame 11 via aperture 7. Then, bond pads 42 of semiconductor die 40 and bond fingers 35 of conductive layer 34 of substrate 30 are electrically connected by wires 44.

Figure 8C:
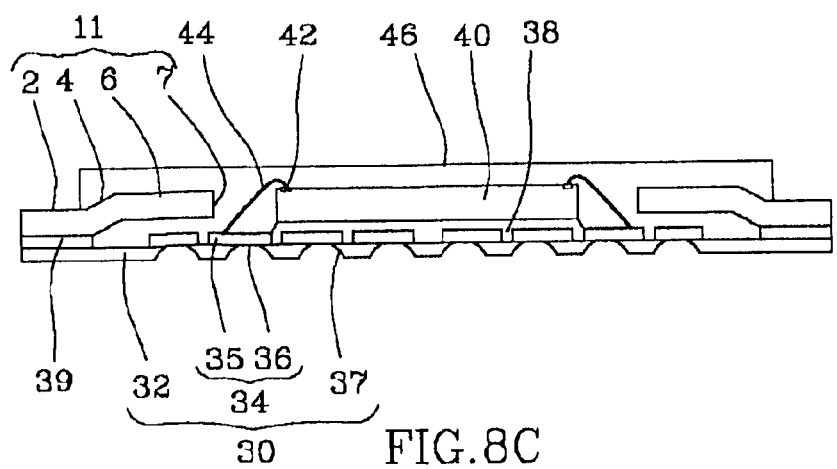
Figure 8D:
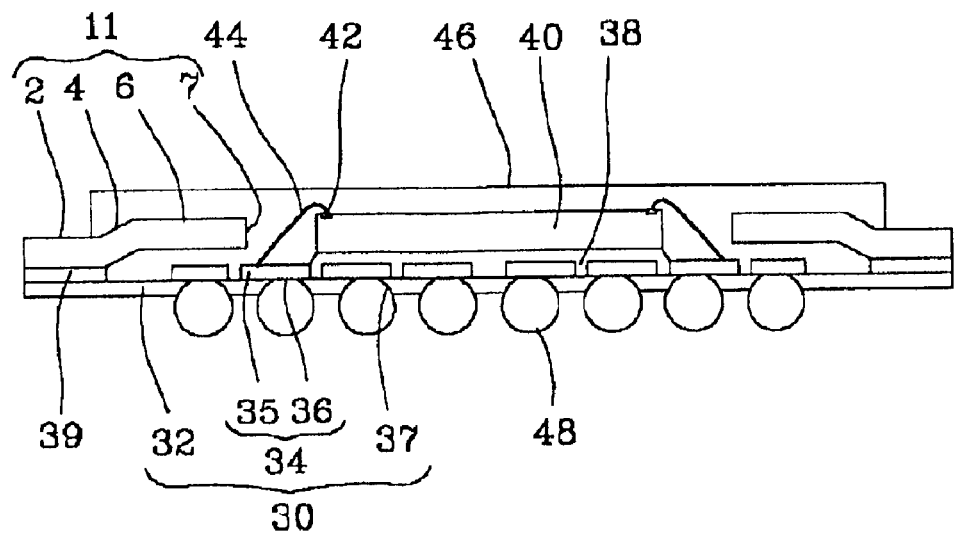

Now referring to FIG. 8C, after encapsulation, carrier frame 11, semiconductor die 40 and wires 44, are covered by an encapsulation 46 formed from an encapsulant such as an epoxy molding compound or equivalent. Next, referring to FIG. 8D, the semiconductor package is shown after a solder ball fusing step is performed. Solder balls 48 are fused to each land 36 exposed to the bottom surface of substrate 30. The solder balls 48 provide for mechanical and electrical connection of the semiconductor package to an external device after manufacture.

Figure 8E:
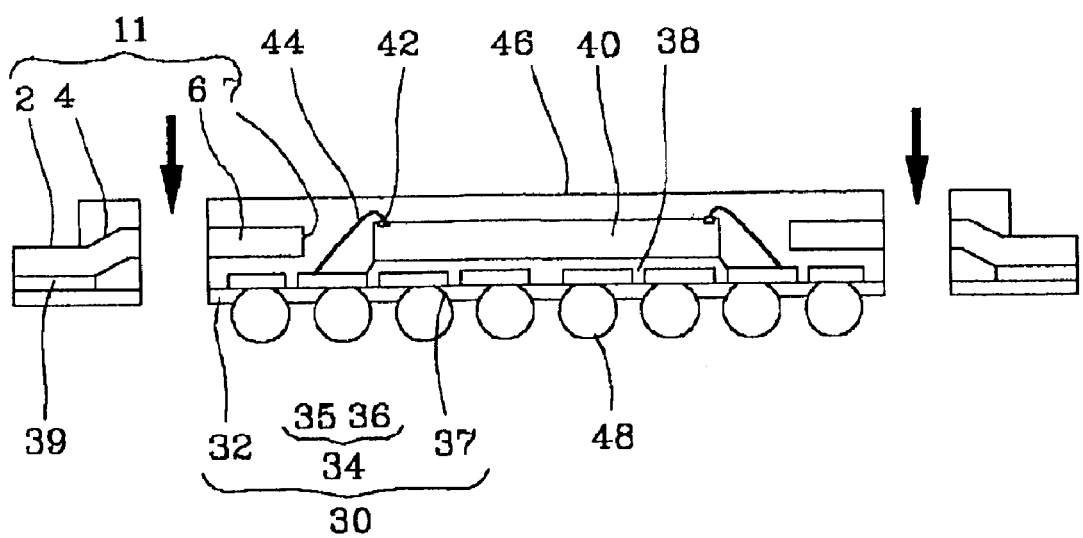

Finally, referring to FIG. 8E, the semiconductor package is, completed by a singulation step, wherein carrier frame 11 is sawn so that inner frame 6 remains inside of encapsulant 46, but the semiconductor package is separate from the rest of carrier frame 11 and a portion of substrate 30.

Figure 9A:
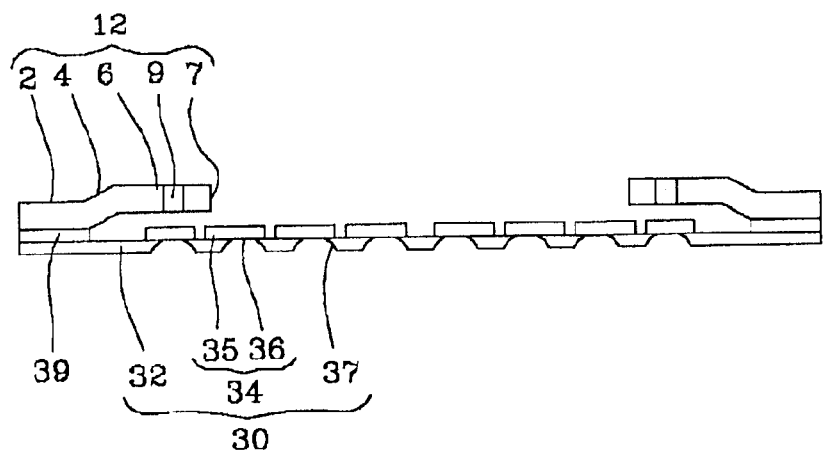
FIGS. 9A–9G are cross-sectional views illustrating a method for manufacturing a semiconductor package in accordance with another embodiment of the present invention.

FIG. 9A through FIG. 9G are cross-sectional views illustrating another method for manufacturing a semiconductor package in accordance with an embodiment of the present invention. Referring first to FIG. 9A, a semiconductor package is depicted after a carrier frame 12 is attached to a substrate 30. Carrier frame 12 includes a substantially planar outer frame 2 and an inclined surface 4 extending upward to outer frame 2 to the inside of an inner frame 6. An aperture 7 of a predetermined size is formed in the center of carrier frame 12.

A substrate 30, on which a conductive layer 34 having bond fingers 35 and lands 36 is disposed, is attached to the bottom surface of outer frame 2 of carrier frame 11 by an attach material 39. In addition, cut portions 8 (see FIG. 2A) can be formed at each corner of inner frame 6. Inner frame 6 further includes holes 9, which pass through inner frame 6 vertically. Substrate 30 includes an insulating layer 32 and a conductive layer 34 Lands 36 are exposed to the bottom surface of substrate 30 through holes 37 formed through insulating layer 32.

Figure 9B:
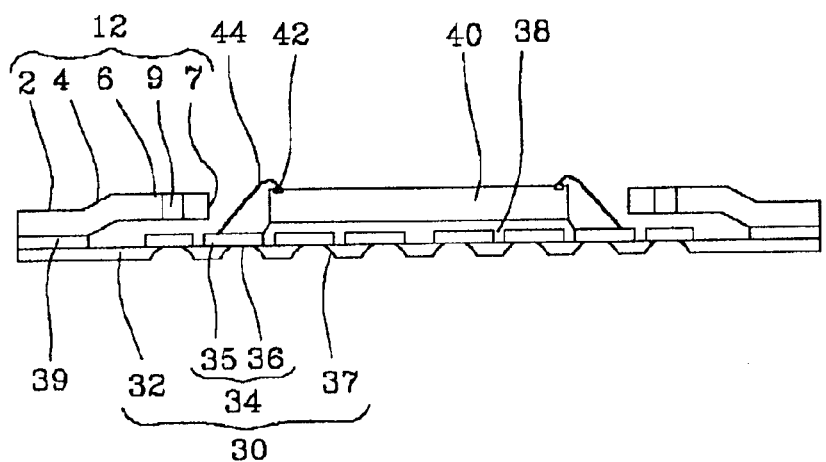

Referring now to FIG. 9B, a semiconductor package is depicted after a die attach and a wire bonding step. Semiconductor die 40 including the bond pads 42 is attached to the top surface of substrate 30. The upper surface of semiconductor die 40 is exposed through aperture 7. Bond pads 42 of semiconductor die 40 and bond fingers 35 of conductive layer 34 of substrate 30 are electrically connected by wires 44.

Figure 9C:
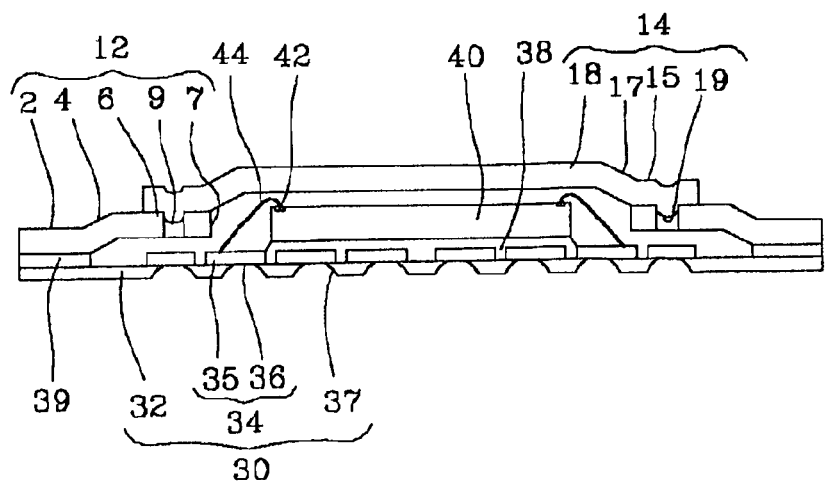
Figure 9D:
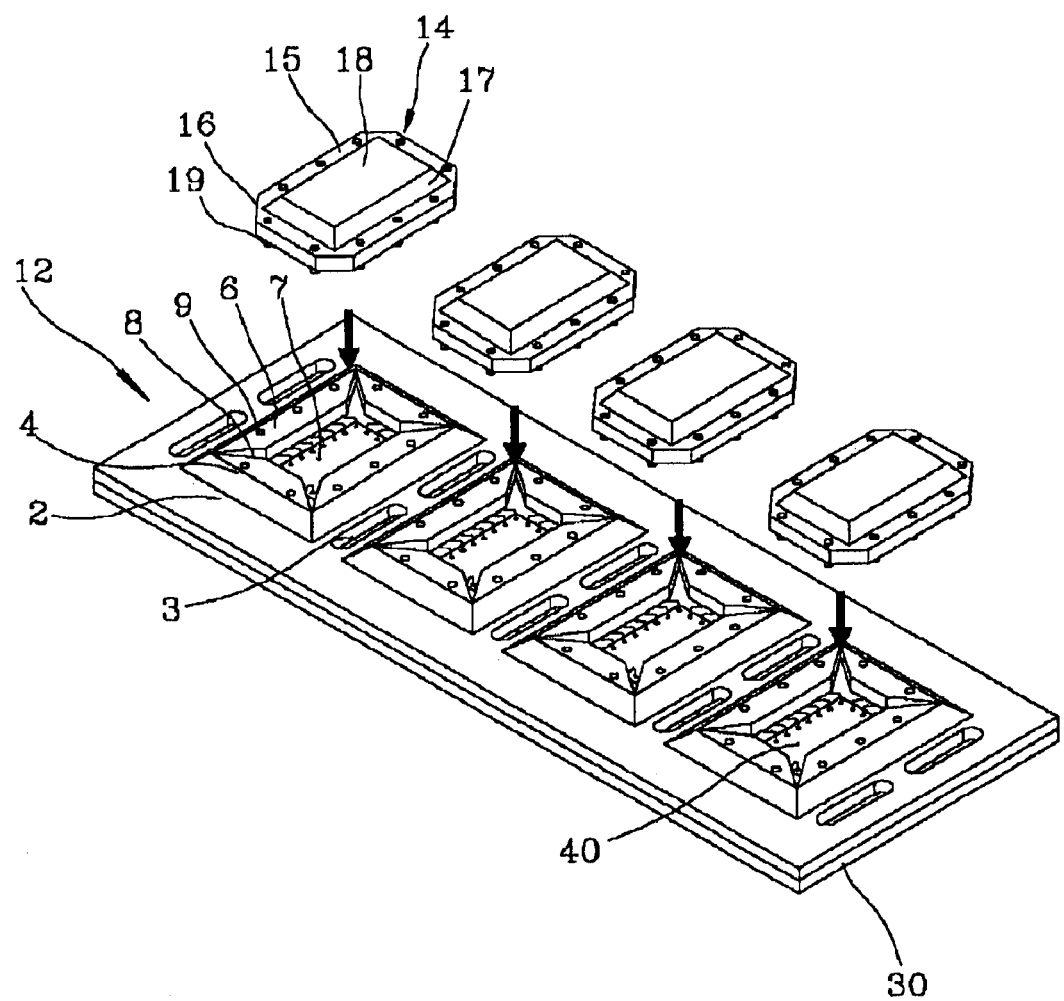

Now referring to both FIGS. 9C and 9D, the semiconductor package is depicted after an auxiliary frame 14 is attached. Auxiliary frame 14 is mounted on the top surface of inner frame 6. Auxiliary frame 14 includes a substantially planar flange 15 having chamfers 16 formed at each corner and coupled with the top surface of inner frame 6. Auxiliary frame 14 further includes inclined surface 17 extending upward from flange 15 to a cover 18 in the inside of inclined surface 17 for covering aperture 7 of inner frame 6. Protrusions 19 further formed on the bottom surface of flange 15 and having locations corresponding to the locations of holes 9 of inner frame 6 align with holes 9 so that the auxiliary frame 14 is easily aligned with and coupled to inner frame 6.

Figure 9E:
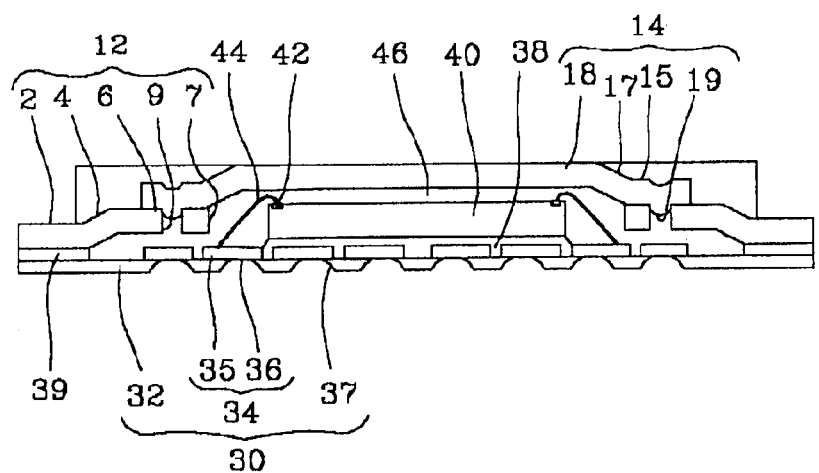

Referring next to FIG. 9E, the semiconductor package is depicted after an encapsulant has been applied. The encapsulant fills the volume around semiconductor die 40 through cut portions 8 formed in inner frame 6 to form encapsulation 46. In an alternative embodiment, it is preferable that the top surface of the cover 18 is exposed through the top surface of encapsulation 46, to improve thermal transfer.

Figure 9F:
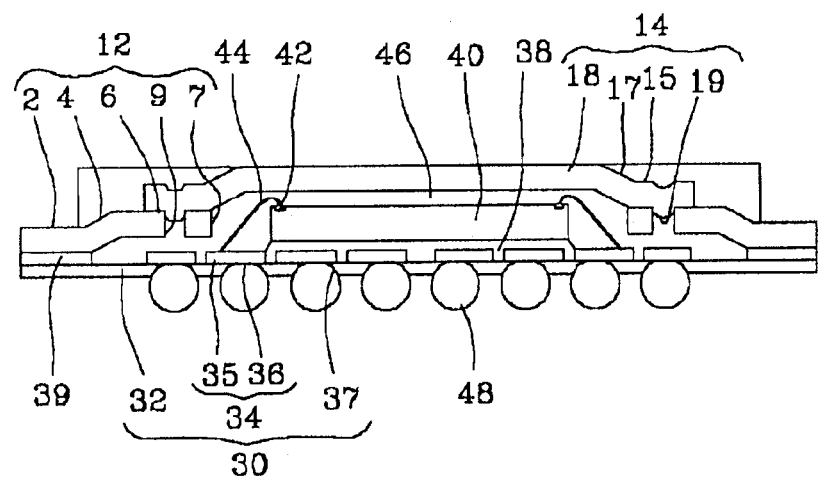

Referring next to FIG. 9F, the semiconductor package is depicted after solder balls 48 are fused to each land 36 exposed through the bottom surface of substrate 30 by holes 37. The solder balls 48 provide for electrical and mechanical connection of the semiconductor package to an external device after manufacture.

Figure 9G:
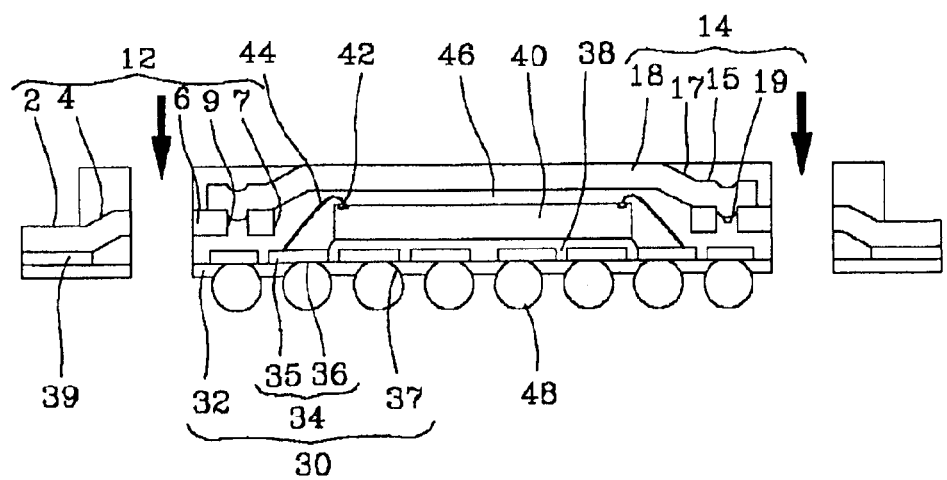

Referring last to FIG. 9G, the semiconductor package is shown after singulation. Carrier frame 12 is sawn so that inner frame 6 and auxiliary frame 14 are retained within encapsulant 46, but separating the semiconductor package from carrier frame 12 and a portion of substrate 30.

Figure 10A:
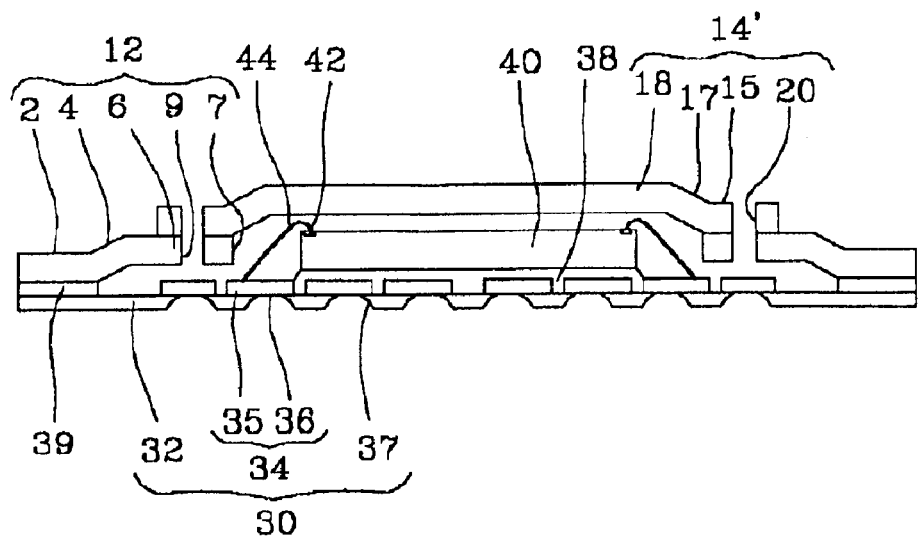
FIGS. 10A–10B are cross-sectional views illustrating a method for manufacturing a semiconductor package in accordance with another embodiment of the present invention.
Figure 10B:
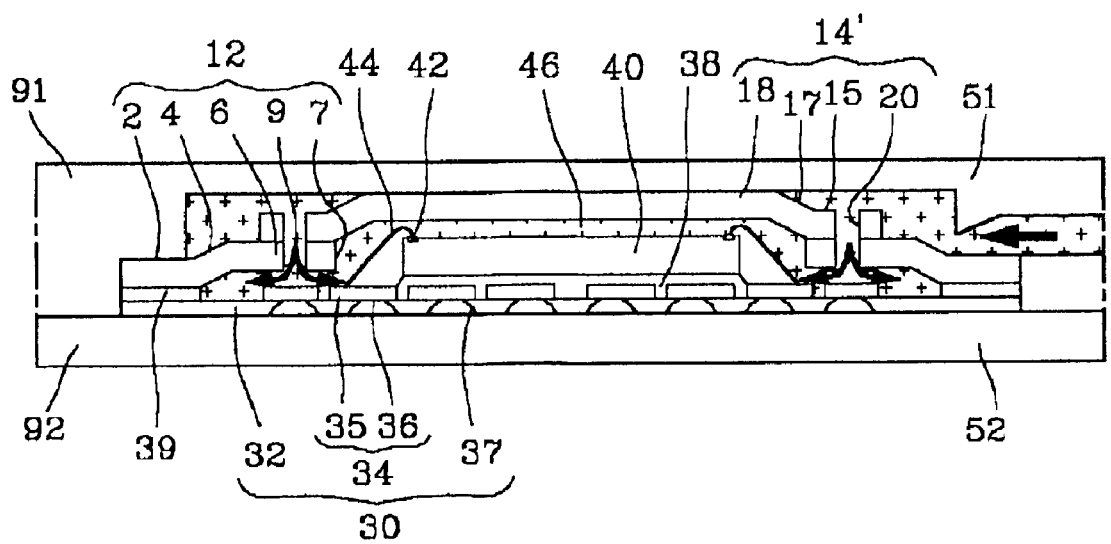

FIGS. 10A and 10B are cross-sectional views illustrating another method for manufacturing a semiconductor package in accordance with an embodiment of the present invention. As the manufacturing method for producing semiconductor package 103 is similar to that for producing semiconductor package 102 as described above, only those differences between the methods will be described in detail below. In semiconductor package 102 as described above, encapsulant flows around semiconductor die 40 through only cut portions 8 formed in inner frame 6 to form encapsulant 46. But, in the semiconductor package 103 as shown in FIG. 7A, since holes 9 of inner frame 6 and holes 20 of auxiliary frame 14' provide a vertical flow path through inner frame 6 and auxiliary frame 14, an encapsulant may flow around semiconductor die 40 through holes 9 and holes 20 as well as through cut portion 8, providing improved flow of encapsulant during formation of encapsulation 46.

Holes 9 of and holes 20 of the auxiliary frame 14' are coupled together after encapsulation is complete, improving the bond between encapsulant 46, inner frame 6 and auxiliary frame 14'. Top mold 51 and bottom mold 52 are shown surrounding semiconductor package to depict the encapsulation process.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
    a substrate comprising a conductive layer having a plurality electrically conductive patterns on a surface thereof;
    a semiconductor die attached to the substrate by a die attach material;
    a plurality of conductive connectors electrically connecting the semiconductor die to the electrically conductive patterns of the substrate;
    a reentrant portion of a carrier frame including a substantially planar inner frame elevated above and parallel to the substrate, wherein the inner frame has an aperture formed at the center thereof and having dimensions sized larger than the die dimensions in an plane parallel to the substrate, in order to permit parallel insertion of the semiconductor die after the carrier frame is bonded to the substrate; and
    an encapsulant formed by applying an encapsulant to the semiconductor die, the conductive connectors and the carrier frame.

2. The semiconductor package of claim 1, wherein the substrate includes electrically conductive patterns on a top and bottom surface of the substrate, and wherein the semiconductor package further comprises a plurality of solder balls attached to the conductive patterns on the bottom surface of the substrate for providing electrical and mechanical connection to an external device.

3. The semiconductor package of claim 1, wherein the electrically conductive patterns include a plurality of bond fingers, wherein the semiconductor die includes a plurality of bond pads on a top surface thereof, and wherein the conductive connectors are bond wires each having a first end bonded to a corresponding one of the bond fingers and a second end bonded to a corresponding one of the bond pads.

4. The semiconductor package as claimed in claim 1, wherein the aperture is rectangular aperture, and wherein the inner frame includes cut portions formed at corners of the aperture and extending outward past the cover for permitting entry of encapsulant after installation of the auxiliary header on the inner frame, improving flow of the encapsulant during encapsulation of the semiconductor package by permitting flow of encapsulant through the cut portions and under the auxiliary header.

5. The semiconductor package of claim 1, further comprising an auxiliary header applied over the top surface of the inner frame for covering the aperture after insertion of the semiconductor die and for proving a contiguous metal area covering the semiconductor die via mechanical contact with the reentrant portion of the carrier frame.

6. The semiconductor package of claim 5, wherein the auxiliary header comprises:
    a substantially planar flange at the edges of the auxiliary header;
    a substantially planar cover portion elevated above and substantially parallel to the flange located in the center of the auxiliary header for covering the aperture; and
    an inclined surface disposed between the flange and the cover portion whereby the auxiliary header forms a contiguous structure.

7. The semiconductor package of claim 6, wherein the flange is chamfered at each corner.

8. The semiconductor package of claim 6, wherein a top surface of the cover of the auxiliary frame is coplanar with the top surface of the encapsulant, whereby the cover is exposed at the top surface of the semiconductor package.

9. The semiconductor package of claim 6, wherein the inner frame includes a plurality of holes through the inner frame and located around the periphery of the inner frame, and wherein the flange includes a plurality of protrusions formed on the bottom surface of the flange at locations corresponding with the holes in the inner frame whereby the protrusions and holes provide self-alignment of the auxiliary header to the carrier frame.

10. The semiconductor package of claim 6, wherein the inner frame includes a plurality of holes through the inner frame and located around the periphery of the inner frame, and wherein the flange includes a plurality of holes on the bottom surface of the flange at locations corresponding with the holes in the inner frame whereby the holes are co-located to provide flow of encapsulant under the auxiliary header during encapsulation of the semiconductor package.

11. A semiconductor package, comprising:
    a substrate comprising a conductive layer having a plurality electrically conductive patterns on a surface thereof;
    a semiconductor die attached to the substrate by a die attach material;
    a plurality of conductive connectors electrically connecting the semiconductor die to the electrically conductive patterns of the substrate;
    re-entrant portions of means for rigidly supporting the substrate during manufacture and prior to encapsulation including means for inserting a semiconductor die through an aperture therein; and
    an encapsulant formed by applying an encapsulant to the semiconductor die, the conductive connectors and the supporting means.

12. The semiconductor package of claim 11, wherein the re-entrant portions of the support means further comprise means for conducting heat from the semiconductor die.

13. A carrier frame for a semiconductor package comprising:
    a substantially planar outer frame for attachment to a substrate;

the center thereof and having dimensions sized larger than the die dimensions in an plane parallel to the substrate, in order to permit insertion of a semiconductor die parallel to the substrate after the carrier frame is attached to the substrate; and an inclined surface disposed between the outer frame and the inner frame, whereby the carrier frame comprises a contiguous structure.

14. The carrier frame of claim 13, wherein the carrier frame includes a plurality of inner frames and a plurality of inclined surfaces each disposed between each of the inner frames and the outer frame, whereby a plurality of semiconductor dies may be inserted within the apertures of the inner frames and a plurality of semiconductor packages can be produced by encapsulating and sawing the inner frames from the carrier frame after encapsulation.

15. The carrier frame of claim 13, wherein the aperture is a rectangular aperture wherein the inner frame includes cut portions formed at corners of the aperture and extending outward from the corners for permitting entry of an encapsulant under the auxiliary header, improving flow of the encapsulant during encapsulation of the semiconductor package.

16. The carrier frame of claim 13, further comprising an auxiliary header applied over the top surface of the inner frame for covering the aperture subsequent to insertion of the semiconductor die and for providing a contiguous metal area covering the semiconductor die via contact with the inner frame.

17. The carrier frame of claim 16, wherein the auxiliary header comprises:

an approximately planar flange at the edges of the auxiliary header;

a substantially planar cover portion elevated above and substantially parallel to the flange located in the center of the auxiliary header for covering the aperture; and an inclined surface disposed between the flange and the cover portion whereby the auxiliary header forms a contiguous structure.

18. The carrier frame of claim 17, wherein the flange is chamfered at each corner.

19. The carrier frame of claim 17, wherein the inner frame includes a plurality of holes through the inner frame and located around the periphery of the inner frame, and wherein the flange includes a plurality of protrusions formed on the bottom surface of the flange at locations corresponding with the holes in the inner frame whereby the protrusions and holes provide self-alignment of the auxiliary header to the carrier frame.

20. The carrier frame of claim 17, wherein the inner frame includes a plurality of holes through the inner frame and located around the periphery of the inner frame, and wherein the flange includes a plurality of holes on the bottom surface of the flange at locations corresponding with the holes in theinner frame whereby the holes are co-located to provide flow of encapsulant under the auxiliary header during encapsulation of the semiconductor package.

* * * * *